United States Patent
Watanabe et al.

(10) Patent No.: US 8,045,311 B2
(45) Date of Patent: Oct. 25, 2011

(54) LOAD DRIVING AND DIAGNOSIS SYSTEM AND CONTROL METHOD

(75) Inventors: Mitsuhiko Watanabe, Odawara (JP); Chihiro Sato, Kasama (JP); Ryoichi Oura, Hitachinaka (JP); Hirofumi Kurimoto, Hitachinaka (JP); Koichi Ono, Naka (JP)

(73) Assignee: Hitachi, Ltd., Tokyo (JP)

( * ) Notice: Subject to any disclaimer, the term of this patent is extended or adjusted under 35 U.S.C. 154(b) by 297 days.

(21) Appl. No.: 12/336,941

(22) Filed: Dec. 17, 2008

(65) Prior Publication Data
US 2009/0174980 A1 Jul. 9, 2009

(30) Foreign Application Priority Data
Jan. 9, 2008 (JP) ................... 2008-002134

(51) Int. Cl.
*H02H 3/20* (2006.01)
(52) U.S. Cl. ........................................................ 361/94
(58) Field of Classification Search ...................... 361/94
See application file for complete search history.

(56) References Cited

U.S. PATENT DOCUMENTS
2002/0079944 A1* 6/2002 Sander .......................... 327/309

FOREIGN PATENT DOCUMENTS

| DE | 10 2005 057 765 A1 | 6/2007 |
|----|--------------------|--------|
| EP | 0 252 541 A1 | 1/1988 |
| EP | 0 483 744 A2 | 5/1992 |
| EP | 0 743 751 A3 | 11/1996 |
| EP | 1 357 461 A2 | 10/2003 |
| JP | 4-172962 A | 6/1992 |
| JP | 2005-295655 A | 10/2005 |

OTHER PUBLICATIONS

European Search Report dated Apr. 6, 2009 (Five (5) pages).
European Search Reported dated Jul. 2, 2009 (Eleven (11) pages).

* cited by examiner

*Primary Examiner* — Rexford Barnie
*Assistant Examiner* — Nicholas Ieva
(74) *Attorney, Agent, or Firm* — Crowell & Moring LLP

(57) ABSTRACT

A load driving and diagnosis system controls the feed and block of a load current flowing into an inductor such as a solenoid. The load driving and diagnosis system holds a counter-electromotive force, which is developed when the load current is blocked, at a voltage higher than a supply voltage so that the load current will decay for a short time. When an overcurrent condition is established in the load driving and diagnosis system because of a short circuit to a power supply, a malfunction of a circuit or destruction thereof may take place. In addition to a voltage holding means that holds a switching circuit output voltage at a predetermined voltage, a voltage holding means having a different predetermined voltage set therein is included. Moreover, a selection switch that switches the predetermined voltages according to a detected overcurrent condition is included.

8 Claims, 19 Drawing Sheets

LOAD DRIVING AND DIAGNOSIS SYSTEM AND CONTROL METHOD

CLAIM OF PRIORITY

The present application claims priority from Japanese patent application serial No. 2008-002134 filed on Jan. 9, 2008, the content of which is hereby incorporated by reference into this application

BACKGROUND OF THE INVENTION

1. Field of the Invention

The present invention relates to protection of a load driving and diagnosis system that feeds a current to a connected load so as to drive the load, and a diagnosis method implemented in the system.

2. Description of the Related Art

Many loads are mounted in a vehicle, and switches formed with semiconductors are used to control conductions of the loads. The semiconductor switches are generally adopted because they contribute to a reduction in a price or a weight. For a further reduction in the price, a control device having a semiconductor switch and a drive circuit, which drives the semiconductor switch, integrated thereinto is often employed in the form of an integrated circuit. Referring to FIG. 15, the control device will be described below.

In FIG. 15, there are shown a CPU control means 1 that controls the timing of energizing or de-energizing a load, a load drive command 2, an input command terminal 3 of an integrated circuit 31, an input buffer 4, an internal command signal 5, a driver drive/shutoff means 6 that drives or shuts off a driver, a drive/shutoff control signal 7, a driver means 8 that drives a semiconductor switch, a high-side driver 8a, a low-side driver 8b, a gate driving sink current 10 to be produced by the high-side driver 8a, and a gate driving source current 11 to be produced by the low-side driver 8b.

Reference numeral 12 is a gate signal with which the semiconductor switch is directly controlled. Reference numeral 13 is a semiconductor switching circuit that is the semiconductor switch, and reference numeral 13a is a parasitic diode, 13b is a gate input parasitic capacitor of the semiconductor switching circuit. Reference numeral 29 is a switching circuit output voltage of the semiconductor switching circuit 13 which is outputted to outside through an output terminal 30.

Reference numeral 16 is a switching circuit input current that flows through the semiconductor switching circuit 13. Reference numeral 17 is a shunt resistor for current detection. An overcurrent detection means 22 detects an overcurrent condition according to a potential difference 21 between voltages 19 and 20 at the terminals of the shunt resistor. Reference numeral 23 is an overcurrent detection signal. Reference numeral 24 is a break condition holding means that when an overcurrent condition is established, sustains a break condition for a predetermined time that starts at the timing at which the overcurrent detection signal 23 is outputted. Reference numeral 25 is a break condition holding signal that is inputted to the driver drive/shutoff means 6. The semiconductor switching circuit 13 is broken in response to an output signal of the driver drive/shutoff means 6.

Reference numeral 26 is a diagnostic output means that outputs diagnostic information to the CPU control means 1, inputs the overcurrent detection signal 23, and outputs a diagnostic output signal 28 according to a CPU readout control signal 32. Reference numeral 27 is a diagnostic output terminal, and reference numeral 33 is a readout control signal input terminal. Reference numeral 49 is a voltage holding means.

When a switch output voltage 29 reaches a predetermined voltage, the voltage holding means 49 turn on the semiconductor switching circuit 13 to sustain the predetermined voltage. Reference numeral 100 is a ground, and reference numeral 101 is a power supply. Moreover, reference numeral 31 is a semiconductor integrated circuit having the control device integrated on a chip.

Moreover, the diagnostic output means 26 of the semiconductor integrated circuit has a constitution shown in FIG. 16. In FIG. 16, there are shown an output circuit 26a that outputs diagnostic information according to the CPU readout control signal 32, an state transition means 26b that makes a state transition for overcurrent detection and diagnosis according to the overcurrent detection output signal 23. Reference numeral 61 is an overcurrent diagnostic output signal signifying that an overcurrent diagnostic state is set up.

The semiconductor integrated circuit 31 is generally used while being connected to an external load in a constitution shown in FIG. 17. In FIG. 17, there are shown a terminal capacitor 43 included for protecting the semiconductor integrated circuit from noises including a surge, and a wire harness 40 which is coupled to the switch output terminal 30 and to which a load 42 is coupled. Reference numeral 41 is a parasitic inductor of the wire harness 40. Reference numeral 45 is a reverse current that flows from the semiconductor integrated circuit 31 to the power supply due to a counter-electromotive force.

In the constitution, when a short circuit 44 to the power supply 101 of the load occurs accidentally, a current flows from the power supply 101 directly to the switch output terminal 30. A break is carried out in order to protect the semiconductor switching circuit 13.

In relation to the foregoing constitution, actions of respective circuits will be described in conjunction with the timing chart of FIG. 18 and the state transition chart of FIG. 19. In FIG. 18, reference numeral 60 is a period during which the power supply 101 of the load 42 is short-circuited. Reference numeral 61 is a transitional state of the state transition means 26b. The other reference numerals denote the same components as those shown in FIG. 15.

The load drive command 2 is inputted from the CPU control means. The semiconductor switching circuit 13 is turned on at timing A. The input current 16 flows into the semiconductor switching circuit 13, and the output terminal voltage 29 is driven low at the same time. Thereafter, if the power-supply short circuit 60 occurs at timing B, since current limiting by the load 42 is invalidated, the input current 16 increases. When the current value reaches a predetermined threshold (16a) at timing C, the voltage 21 across the terminals of the shunt resistor 17 for current detection, that is, the potential difference 21 between the terminals thereof increases and exceeds a predetermined threshold. Consequently, the overcurrent detection signal 23 is outputted.

The overcurrent detection signal 23 is inputted to the break condition holding means 24. Accordingly, the overcurrent break holding signal 25 is outputted and inputted to the driver drive/shutoff means 6. The drive/shutoff control signal 7 is driven high at timing D. Consequently, the sink current 11 flows into the driver means 8, and the gate signal 12 is driven low. Eventually, the semiconductor switching circuit 13 is turned off (broken).

At this time, a counter-electromotive force is developed in the parasitic inductor 41 of the wire harness 40 because of the break of the semiconductor switching circuit 13. A surge 29a occurs in the switching circuit output voltage 29. Since the voltage holding means 49 is added to the output stage of the semiconductor switching circuit, the surge 29a is held at a voltage level 29b. Since the terminal capacitor 43 is externally added to the switch output terminal 30, the capacitor is charged with the voltage of the voltage level 29b at which the surge is held.

When the load is normally energized or de-energized, the voltage level 29b is usually set to a voltage higher than the supply voltage level in order to quickly block a load current. Consequently, when a break occurs under an overcurrent condition as mentioned above, the voltage level 29b gets higher than the supply voltage 101. The reverse current 45 therefore flows from the terminal capacitor 43, which is charged at the voltage level 29b, to the power supply 101.

The current flows through the parasitic inductor 41. Even after the terminal capacitor 43 is discharged, the current attempts to keep flowing, and attracts a current from the switching circuit output terminal 30. Consequently, the switching circuit input current becomes a negative current 16b, and a current is attracted from the output terminal 30. At the same time, the switching circuit output voltage 29 drops to be a negative voltage.

The instant that a break occurs at timing D, an LC oscillation arises between the terminal capacitor 43 and parasitic inductor 41. Consequently, a negative current flows into the switching circuit output terminal 30. Eventually, a phenomenon in which the switching circuit output voltage 29 drops to be negative takes place.

According to the conventional technology, as described in Patent Document 1, when a break occurs after an overcurrent is detected, the sink current 11 of the semiconductor switch driver means 8 is controlled in order to alleviate the adverse effect of the phenomenon. Since a semiconductor switching circuit exists as a unit in a semiconductor switching device such as an insulated-gate bipolar transistor (IGBT) employed in the related art, a large current can flow into the circuit. Therefore, the sink current 11 is controlled in order to gradually decrease a switch break speed. Since the break speed thus gets lower, any problem is not posed by the counter-electromotive force.

The patent document 1: JP-A-04-172962.

However, when the semiconductor switching circuit 13 is broken, if the negative current like the one 16b flows, the constitution including the semiconductor integrated circuit 31 may be gravely damaged. The semiconductor switching circuit 13 is normally formed with an n-channel MOS, and is generally accompanied by a parasitic diode 13a.

The negative current flows through the parasitic diode 13a. This causes the potential at the n-type layer on the semiconductor integrated circuit to drop to be negative. Consequently, another parasitic element may be generated and a malfunction of a circuit maybe invited. Moreover, a latch-up that is a large-current inflow phenomenon occurs due to conduction of a parasitic transistor, though it depends on a temperature requirement or a layout requirement for the semiconductor integrated circuit. Eventually, the semiconductor integrated circuit may be thermally destroyed or any other serious problem may arise.

The above phenomenon can be prevented by excluding the terminal capacitor 43 or diminishing the capacitance. However, the durability against an externally applied surge may be degraded, and surge destruction may occur. Moreover, even when an optimal capacitance is selected for the terminal capacitor for fear an LC oscillation may occur, since the requirement for the parasitic inductor 41 varies depending on the length of the external harness 40 or the like, it is very hard to determine the capacitance of the terminal capacitor which meets every requirement.

In the constitution having the semiconductor switching circuit included in the semiconductor integrated circuit, many circuits are integrated on the same silicon substrate. Moreover, the semiconductor switching circuit 13 is designed to occupy a minimum necessary area for the purpose of decreasing an entire area. If a large current keeps flowing for a long period of time, the semiconductor switching circuit would be destroyed due to heat dissipation. In other words, there is difficulty in selecting an optimal gradient in a breaking current, which brings about neither the surge 29a nor thermal destruction, and realizing a circuit that employs the breaking current.

Moreover, a control-related problem described below confronts actions to be performed during a break derived from generation of an overcurrent. As shown in FIG. 16, the overcurrent detection means 22 detects an overcurrent condition, and the outputted overcurrent detection signal 23 is inputted to the state transition means 26b included in the diagnostic output means 26. In the state transition means 26b, a state transition is made as shown in FIG. 19. In FIG. 19, reference numeral 61a is a normal state, and reference numeral 61b is an overcurrent-sensed state.

In the normal state, an overcurrent diagnostic output 61 is set to 0. When an overcurrent condition is established, if the overcurrent detection signal 23 is outputted, the normal state is shifted to the overcurrent sensed state 61b. The overcurrent diagnostic output 61 is set to 1. Thereafter, the CPU readout control signal 32 is inputted from the CPU control means 1, and the overcurrent diagnostic output is read out. A transition is then made to the normal state. The overcurrent diagnostic output 61 is reset to 0. Simultaneously, information on the overcurrent diagnosed state is read into the CPU control means. Owing to the state transition, the CPU control means senses the overcurrent condition established in the load driving and diagnosis system, and controls the semiconductor switching circuit.

In the load driving and diagnosis system, assuming that a break occurs at timing D in FIG. 18 due to establishment of an overcurrent condition, after a predetermined pause period 25a elapses, a reset action may be automatically performed. This is a generally adopted control method. For example, when an overcurrent break occurs due to an instantaneous contact, the semiconductor switching circuit is automatically reset to the normal state in order to minimize an adverse effect on the system.

At this time, if the CPU control means reads a state-transition signal at, for example, the timing of a pulse 32b, the CPU control means can recognize the overcurrent condition at least once. However, when the CPU control means reads the state-transition signal at the timing of a pulse 32b at which the break condition still persists, since the state of the semiconductor switching circuit is returned to the normal state 61a, the CPU control means recognizes that the semiconductor switching circuit is normal.

Consequently, the CPU control means cannot recognize that the semiconductor switching circuit has entered the break condition, but controls the semiconductor switching circuit as a circuit that acts normally. Therefore, a trouble may arise in terms of control. Namely, a system malfunction may occur or the break condition caused by an overcurrent may persist while being unidentified.

An object of the present invention is to realize a load driving and diagnosis system that is insusceptible to the capacitance of a terminal capacitor or the inductance of a parasitic inductor dependent on the length of a harness and that is not adversely affected by a negative current during a break.

Another object of the present invention is to provide a load driving and diagnosis system that even when a break caused by an overcurrent persists, can accurately identify the break persistent state.

SUMMARY OF THE INVENTION

In order to solve the aforesaid problems, the present invention includes, in addition to a voltage holding means that holds a switching circuit output voltage at a predetermined voltage, multiple pieces of voltage holding means having another predetermined voltages set therein, and a selection switch that switches the predetermined voltages according to detection of an overcurrent condition.

Moreover, the present invention includes a delay means that after the predetermined voltages are switched due to establishment of the overcurrent condition, produces a predetermined delay time for the purpose of reliably breaking the semiconductor switching circuit.

Moreover, after breaking the semiconductor switching circuit is executed in the overcurrent condition, an overcurrent break holding signal outputted from a break condition holding means 24 is inputted to a diagnostic output means. A state transition means makes a state transition according to the overcurrent break holding signal. Otherwise, after breaking the semiconductor switching circuit is executed in the overcurrent condition, the state transition means makes a state transition according to a gate signal with which the semiconductor switching circuit is directly controlled.

Moreover, after breaking the semiconductor switching circuit is executed in the overcurrent condition, a state transition means makes a state transition according to a gate signal with which the semiconductor switch circuit is directly controlled, and a diagnostic readout signal sent from a CPU control means.

The load driving and diagnosis system is incorporated in a semiconductor circuit device for load driving.

According to the present invention, a load driving and diagnosis system that even when a break occurs in an overcurrent condition, can normally execute breaking irrespective of the state of a terminal capacitor or a parasitic inductor of an external harness can be realized.

Moreover, a load driving and diagnosis system that even when a break derived from an overcurrent persists, accurately grasps the state and performs optimal diagnosis can be realized.

DETAILED DESCRIPTION OF THE PREFERRED EMBODIMENTS

Referring to FIG. 1 to FIG. 14, embodiments of the present invention will be described below.

First Embodiment

Figure 1:
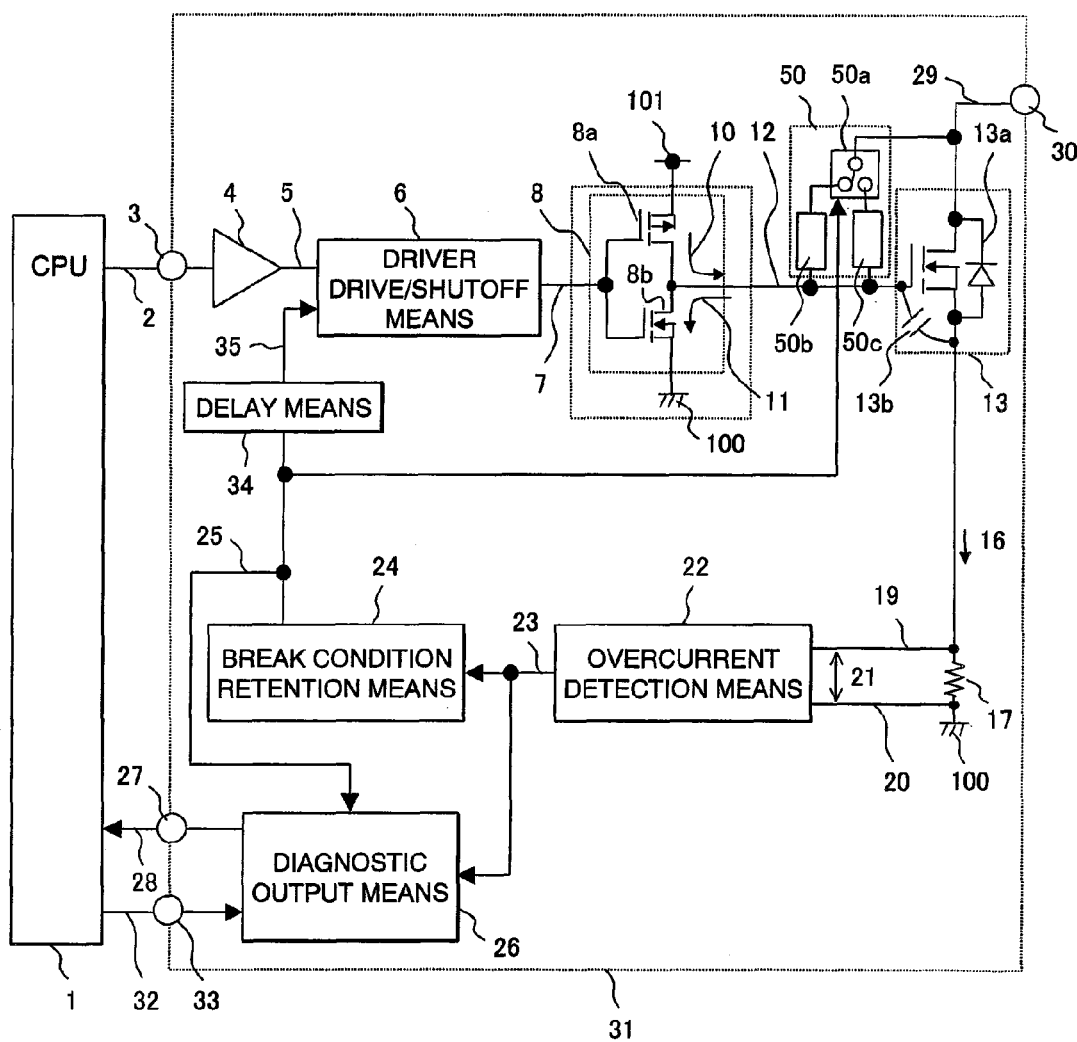
FIG. 1 is a circuit block diagram for use in explaining the first embodiment of the present invention.

FIG. 1 is a block diagram showing an example of a load driving and diagnosis system for the purpose of explaining the first embodiment in accordance with the present invention. In FIG. 1, there are shown a CPU control means 1 that controls the timing of energizing or de-energizing a load, a load drive command 2, an input command terminal 3 of an integrated circuit 31, an input buffer 4, an internal command signal 5, a driver drive/shutoff means 6 that drives or shuts off a driver, a drive/shutoff control signal 7, a driver means 8 that drives a semiconductor switch, a high-side driver 8a, a low-side driver 8b, a gate driving sink current 10 produced by the high-side driver 8a, and a gate driving source current 11 produced by the low-side driver 8b.

Reference numeral 12 is a gate signal with which the semiconductor switch is directly controlled. Reference numeral 13 is a semiconductor switching circuit that is the semiconductor switch. Reference numeral 13a is a parasitic diode of the semiconductor switching circuit, and 13b is a gate input parasitic capacitor of the semiconductor switching circuit.

Reference numeral 29 is a switching circuit output voltage of the semiconductor switching circuit 13 that is outputted to outside through an output terminal 30. Reference numeral 16 is a switching circuit input current that flows through the semiconductor switching circuit. Reference numeral 17 is a shunt resistor for current detection. An overcurrent detection means 22 detects an overcurrent condition according to a potential difference 21 between voltages 19 and 20 at the respective terminals of the shunt resistor. Reference numeral 23 is an overcurrent detection signal.

Reference numeral 24 is a break condition holding means that when an overcurrent condition is established, sustains the condition for a predetermined time starting at the timing at which the overcurrent detection signal 23 is outputted. Reference numeral 25 is a break condition holding signal which is inputted to the driver drive/shutoff means 6 and with which the semiconductor switching circuit 13 is broken.

Reference numeral 26 is a diagnostic output means that outputs diagnostic information to the CPU control means. The diagnostic output means 26 inputs the overcurrent detection signal 23, and outputs a diagnostic output signal 28 in response to a CPU readout control signal 32. Reference numeral 27 is a diagnostic output terminal, and reference numeral 33 is a readout control signal input terminal.

Reference numeral 50 is a voltage holding means. A delay means 34 is disposed in a stage preceding the driver drive/shutoff means 6. Reference numeral 50a is a selection switch that has the contacts thereof switched or controlled with the break condition holding signal 25, reference numeral 50b is an output voltage holding means that holds an output voltage at a voltage of a predetermined value A, and reference numeral 50c is an output voltage holding means that holds the output voltage at a voltage of a predetermined value B different from the predetermined value A. When a switch output voltage 29 reaches a predetermined voltage, the semiconductor switching circuit 13 is turned on in order to hold the output voltage at the voltage of the predetermined value A or B for fear the switch output voltage may be equal to or larger than the predetermined value.

Reference numeral 100 is a ground, and reference numeral 101 is a power supply. Moreover, reference numeral 31 is a semiconductor integrated circuit having the foregoing control device integrated on a chip.

Figure 2:
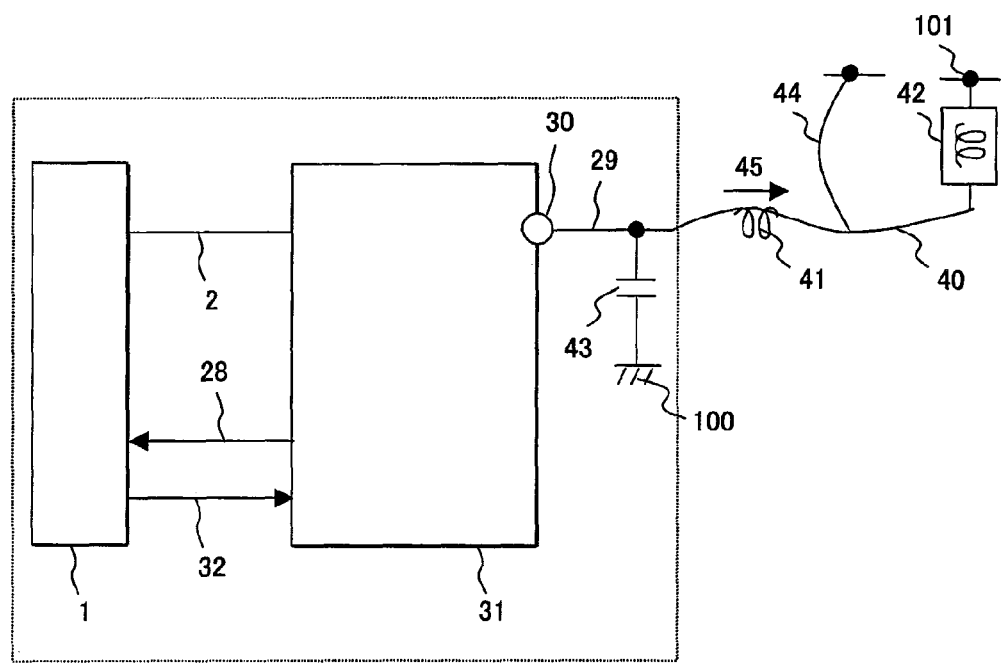
FIG. 2 is a block diagram for use in explaining an example of use of the first embodiment of the present invention.

The semiconductor integrated circuit is generally employed in a constitution shown in FIG. 2. In FIG. 2, there are shown a terminal capacitor 43 that is added in order to protect the semiconductor integrated circuit from noises including a surge, an external wire harness 40 which is coupled to the switch output terminal 30 and to which a load 42 is coupled, and a parasitic inductor 41 of the wire harness whose capacitance may vary depending on the length of the wire harness 40.

Moreover, reference numeral 45 is a reverse current that flows from the semiconductor integrated circuit 31 side to the power supply side owing to a counter-electromotive force. Reference numeral 44 is a short-circuited wiring attained when the wire harness 40 is short-circuited directly to the power supply 101. In the constitution, when a short circuit 44 to the power supply 101 of the load occurs, a current flows from the power supply 101 directly into the switch output terminal 30 over the short-circuited wiring 44. Therefore, the semiconductor switching circuit 13 is broken to be protected.

Figure 3:
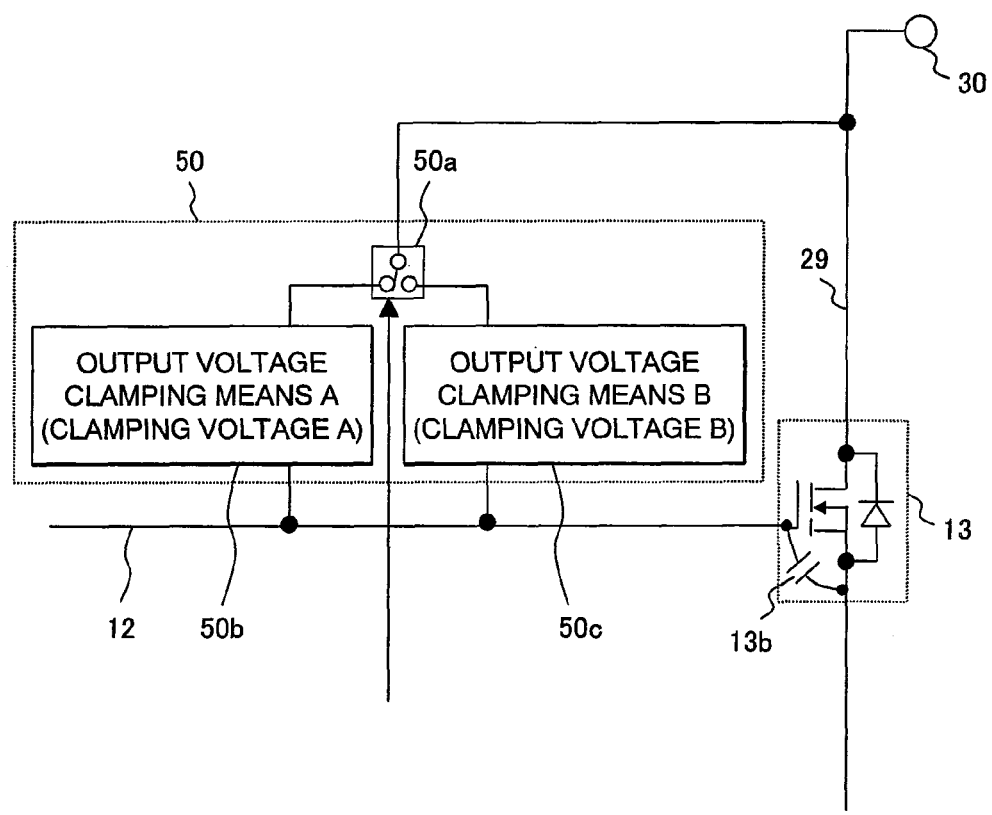
FIG. 3 is a block diagram for use in explaining the internal constitution of a voltage holding means 50 shown in FIG. 1.

FIG. 3 is an explanatory diagram showing the internal constitution of the voltage holding means 50. Reference numeral 50a is a selection switch, reference numeral 50b is an output voltage holding means that holds an output voltage at a voltage of a predetermined value A, and reference numeral 50c is an output voltage holding means that holds the output voltage at a voltage of a predetermined value B different from the predetermined value A. The output voltage holding means 50b and output voltage holding means 50c are switched or controlled with a break condition holding signal 25.

Figure 4:
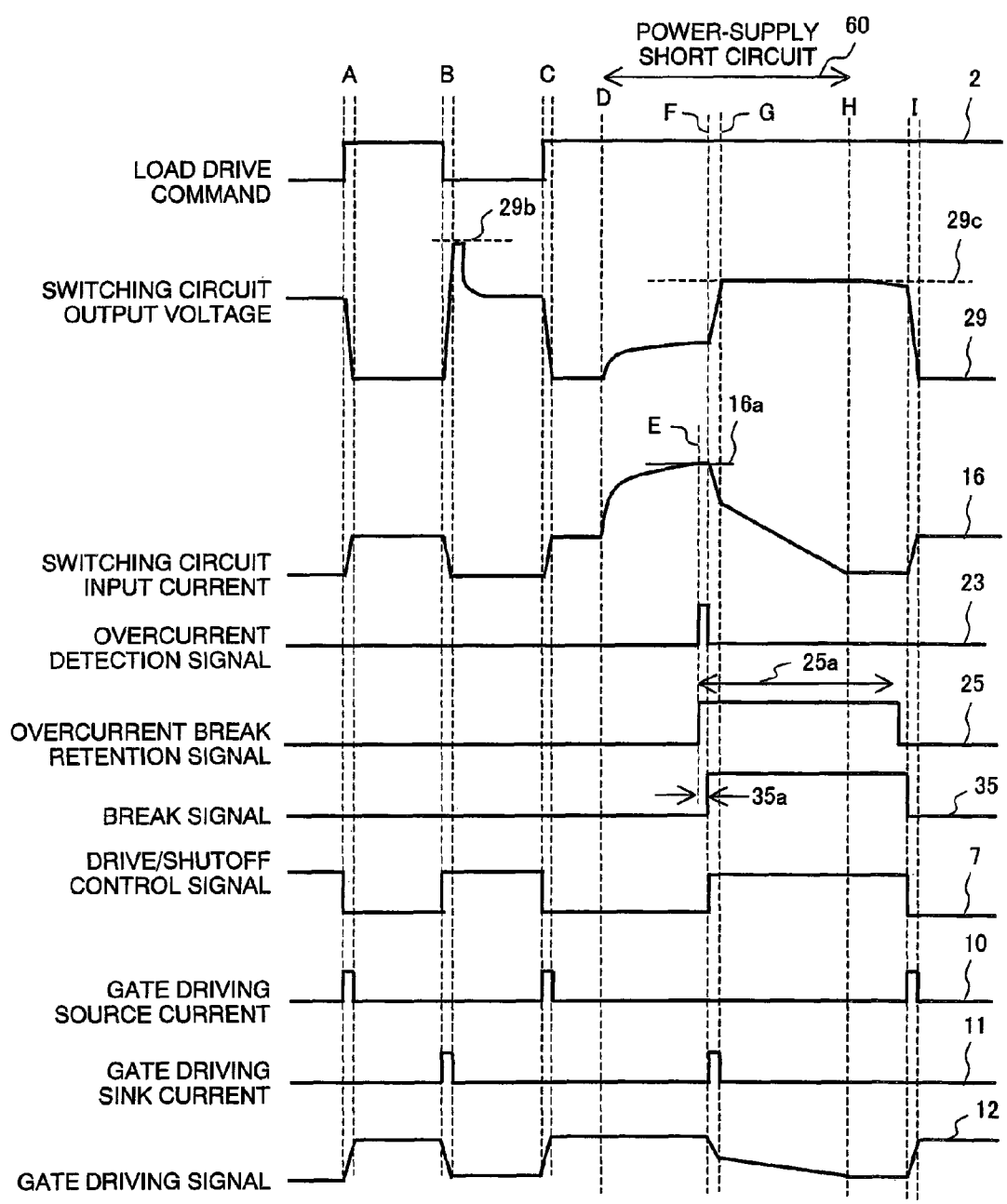
FIG. 4 is a timing chart for use in explaining actions performed in the first embodiment of the present invention.

Normally, the predetermined value A is selected, and the switching circuit output voltage 29 is held at the predetermined value A. When a short circuit occurs, if a break is derived from an overcurrent, the selection switch 50a has the contacts thereof switched to select the predetermined value B different from the predetermined value A, and the switching circuit output voltage 29 is held at the predetermined value B. FIG. 4 is a timing chart relevant to the first embodiment.

Next, actions to be performed in the first embodiment will be described in conjunction with FIG. 1 to FIG. 4. In FIG. 4, reference numeral 60 is a period during which the wire harness 40 is short-circuited to the power supply 101. The other reference numerals denote the same signal waves shown in FIG. 1.

The load drive command 2 is inputted from the CPU control means 1. When the load drive command is driven high at timing A, the internal command 5 is inputted to the driver drive/shutoff means 6 via the input buffer 4. The drive/shutoff control signal 7 is driven low, and inputted to the driver means 8. The gate driving source current 10 is fed from the high-side driver 8a to the gate of the semiconductor switching circuit 13. This causes the gate driving signal 12 to go high. The semiconductor switching circuit 13 is turned on. The input current 16 then flows into the semiconductor switching circuit. At the same time, the output terminal voltage 29 goes low.

Thereafter, when the load drive command 2 goes low at timing B, the drive/shutoff signal 7 is driven high and inputted to the driver means 8. The gate driving sink current 11 then flows from the low-side driver 8b to the gate of the semiconductor switching circuit 13. This causes the gate driving signal 12 to go low. The semiconductor switching circuit 13 is then turned off, and the switching circuit output voltage 29 is driven high.

At this time, a current flows into the load 42. Therefore, when the semiconductor switching circuit 13 is turned off, a counter-electromotive force is generated. The switching circuit output voltage 29 surges to be equal to or higher than the supply voltage. At this time, since the contacts of the selection switch 50a in the voltage holding means 50 are switched to select the means 50b, the raised switching circuit output voltage 29 is held at the predetermined value A (29b in FIG. 4).

Thereafter, at timing C, the load drive command 2 is inputted in the same manner as it is at timing A. After the semiconductor switching circuit 13 is turned on, if a short circuit occurs at timing D, since the current limiting by the load 42 is invalidated, the input current 16 increases. In this case, the voltage 21 across the terminals of the shunt resistor 17 for current detection, that is, the potential difference between the terminals thereof increases.

When the current value reaches a predetermined threshold 16a at timing E, the voltage 21 across the terminals exceeds the predetermined threshold. The overcurrent detection signal 23 is then outputted from the overcurrent detection means 22, and inputted to the break condition holding means 24. The overcurrent break holding signal 25 is then outputted, and inputted to the driver drive/shutoff means 6. The drive/shutoff control signal 7 is driven high at timing F. Consequently, the sink current 11 flows into the driver means 8, and the gate signal 12 goes low. The semiconductor switching circuit 13 is therefore turned off (broken).

At this time, since the overcurrent break holding signal 25 is driven high, the contacts of the selection switch 50a in the voltage holding means 50 are switched to select the output voltage holding means 50c. The output voltage is held at the predetermined value B. In the present embodiment, the predetermined value B is set to a value slightly larger than the value of the supply voltage 101. For safe start of a circuit, the predetermined value B has to be larger than the value of the supply voltage. Moreover, the predetermined value B may be set to any of multiple different optimal values according to a detected battery voltage.

Since the wire harness 40 includes the floating inductance component or parasitic inductor 41, a counter-electromotive force is developed in the parasitic inductor 41 due to the break of the semiconductor switching circuit 13. The switching circuit output voltage 29 surges. However, since the voltage holding means 50 is added to the output stage of the switching circuit, the output voltage value is changed to the predetermined value B. When the switching circuit output voltage 29 having surged exceeds the predetermined value B (29c in the drawing 4), a current is fed to the gate of the semiconductor switching circuit 13. The semiconductor switching circuit 13 is put to a halfway on state, and the switching circuit output voltage 29 is held at the predetermined value B.

Therefore, the terminal capacitor 43 will not be charged with a voltage exceeding the supply voltage 101. The reverse current 45 that is produced in the related art, and an LC oscillation accompanying the reverse current is not induced. Consequently, breaking can be achieved normally without an adverse effect such as a malfunction attributable to the fact that the switching circuit output voltage 29 drops to be negative because a negative current flows into the switching circuit output terminal 30.

Moreover, since switching of the predetermined values at which the output voltage is held is performed only when an overcurrent condition is detected, as long as the on state of the semiconductor switching circuit 13 is normally changed to the off state (timing B), the predetermined value at which the output voltage is held can be set to the higher one (29b in the drawing 4). When the on state is normally changed to the off state, energy exerted by the inductor is absorbed for a short period of time. There is the merit that such a trouble that a current keeps flowing into the load after the semiconductor switching circuit is turned off will not arise.

In the first embodiment, the delay means 34 is disposed in a stage preceding the driver drive/shutoff means 6. When an overcurrent condition is established, the overcurrent break holding signal 25 that is the output of the break condition holding means 24 is delayed by a predetermined time 35a, and then inputted to the driver drive/shutoff means 6. Consequently, when the predetermined values A and B are switched in the voltage holding means 50, the break of the semiconductor switching circuit 13 is delayed by the delay time 35a. The voltage holding means 50 can reliably switch the predetermined values before the semiconductor switching circuit 13 is broken.

Consequently, an unstable action causing the switching circuit output voltage 29 to surge because a break occurs during switching of the predetermined values will not be performed, but an excellent load driving and diagnosis system can be realized.

Second Embodiment

Figure 5:
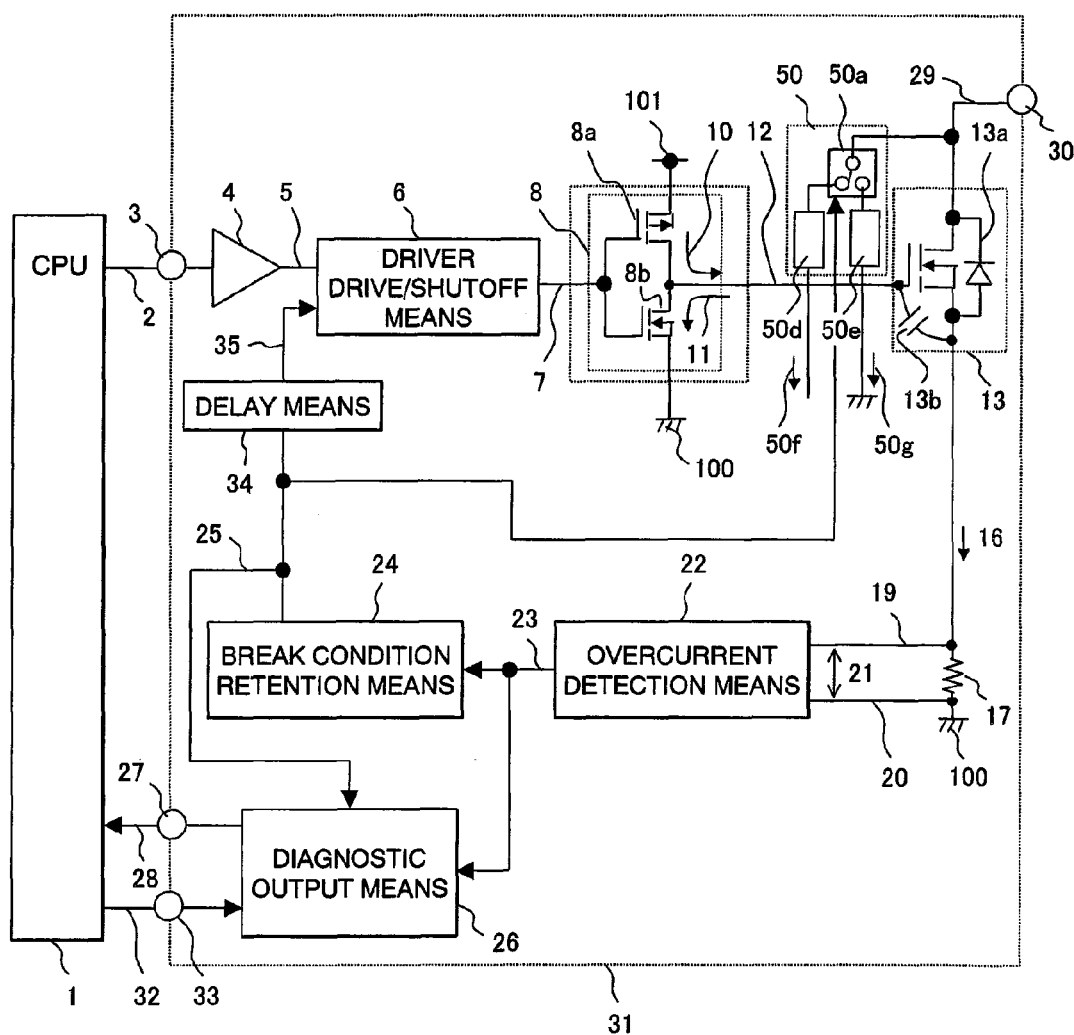
FIG. 5 is a block diagram for use in explaining actions performed in the second embodiment of the present invention.

Next, the second embodiment of the present invention will be described in conjunction with FIG. 5. FIG. 5 is a block diagram showing an example of a load driving and diagnosis system. In FIG. 5, the pieces of output voltage holding means 50d and 50e included in the voltage holding means 50 are grounded. When the switching circuit output voltage 29 surges, if the output voltage has to be held at a predetermined value, a value A holding current 50f or a value B holding current 50g flows during an action of voltage holding. The other constituent features are identical to those of the first embodiment.

Figure 6:
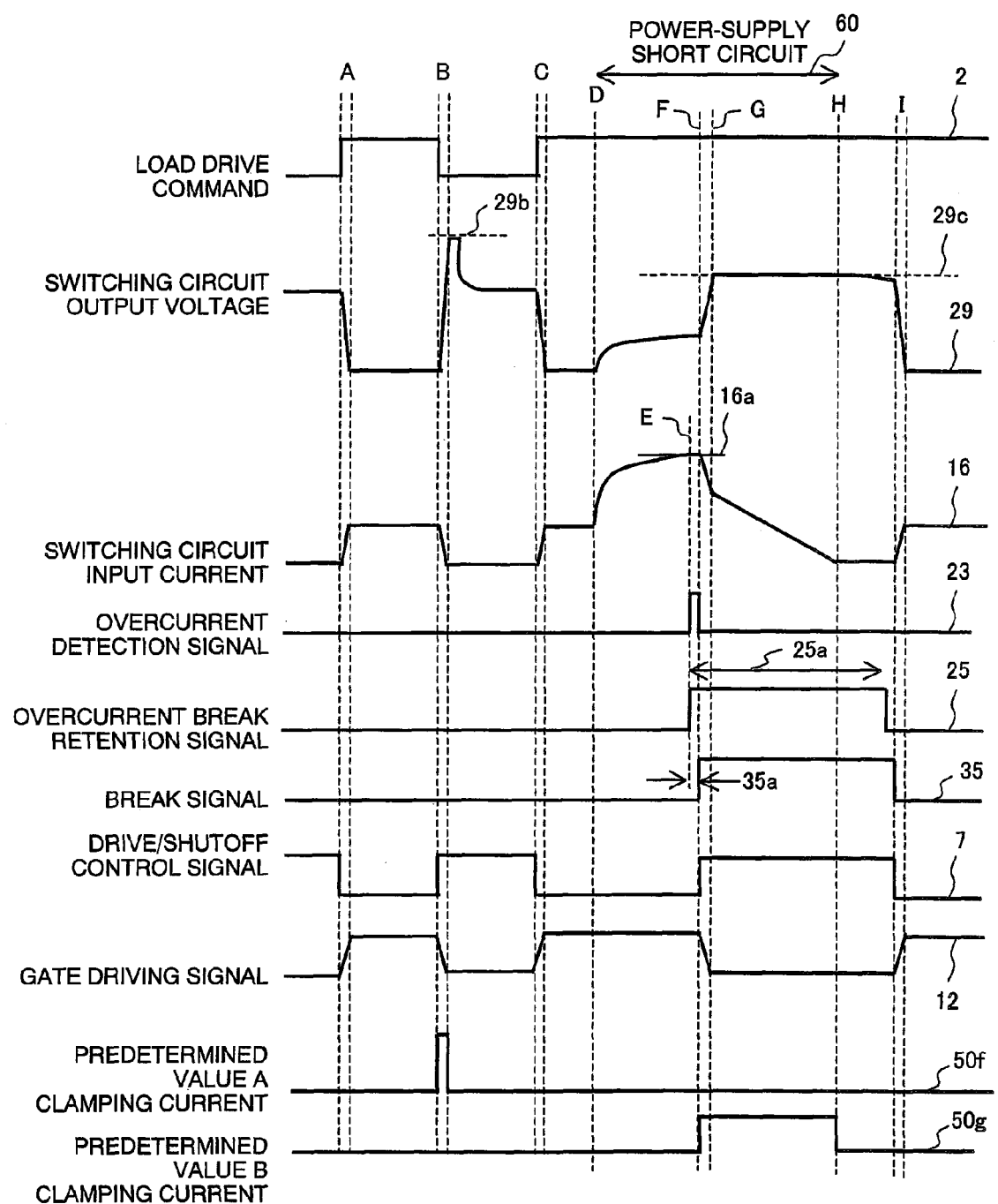
FIG. 6 is a timing chart for use in explaining the actions performed in the second embodiment of the present invention.

The actions to be performed in the present embodiment shown in FIG. 5 will be described in conjunction with the timing chart of FIG. 6. In FIG. 6, when the load drive command 2 with which the semiconductor switching circuit 13 is turned off is inputted at timing B in the same manner as it is in the first embodiment, since the contacts of the selection switch 50a of the voltage holding means 50 are switched to select the predetermined value A, the switching circuit output voltage 29 undergoes a surge 29b along with the turning off of the semiconductor switching circuit 13. A current in the load rapidly decays. On the other hand, if a power-supply short circuit 60 occurs at timing D, an overcurrent flows. At timing E, an overcurrent condition is detected and an overcurrent detection signal 23 is outputted. The overcurrent break holding signal 25 is inputted to the driver drive/shutoff means 6 via the delay means 34. The semiconductor switching circuit 13 is broken.

At this time, the contacts of the selection switch 50a of the voltage holding means 50 are switched to select the predetermined value B in the same manner as they are in the first embodiment. The switching circuit output voltage 29 becomes a voltage 29c. Although a time during which a current flows gets longer, the reverse current 45 and an accompanying LC oscillation are not generated. Therefore, even when an overcurrent is generated, breaking can be normally achieved while being unaffected by the capacitance of the terminal capacitor or the length of the harness.

In the present embodiment, the voltage holding means 50 is included in the semiconductor integrated circuit 31. Alternatively, the voltage holding means 50 may be disposed outside the semiconductor integrated circuit 31, and the output voltage values may be switched or controlled with the overcurrent break holding signal 25 that is outputted externally. Even in this case, the same advantage is apparently exerted.

Third Embodiment

Figure 7:
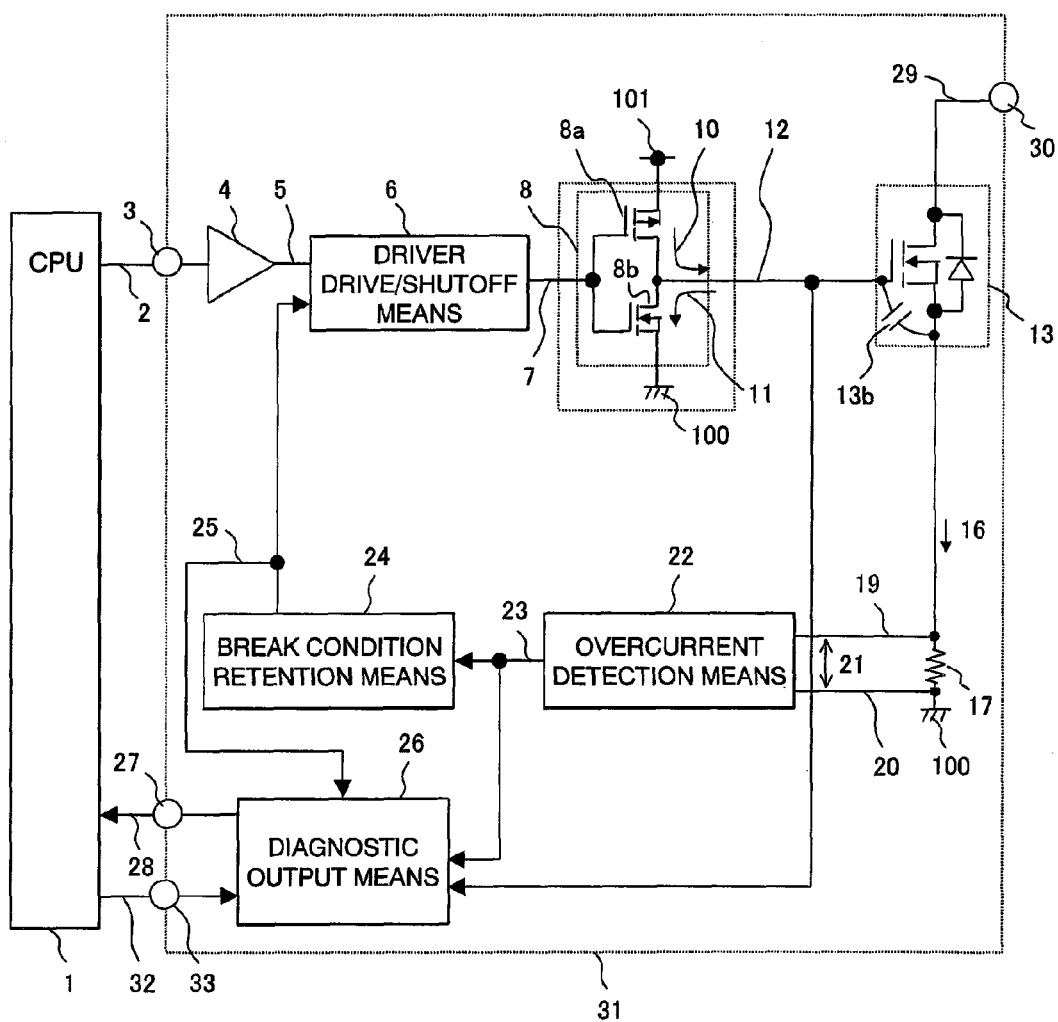
FIG. 7 is a circuit block diagram for use in explaining the third embodiment of the present invention.

Next, the third embodiment of the present invention will be described in conjunction with FIG. 7. FIG. 7 is a block diagram showing an example of a load driving and diagnosis system. In FIG. 7, there is shown a diagnostic output means 26 that outputs a result of diagnosis to outside, for example, to the CPU control means 1, and that inputs the overcurrent detection signal 23 sent from the overcurrent detection means 22, the overcurrent break holding signal 25 sent from the break condition holding means 24, and the gate signal 12.

In this constitution, the diagnostic output means outputs the CPU readout diagnosis signal 28 on the basis of the CPU readout control signal 32 sent from the CPU control means 1.

Figure 8:
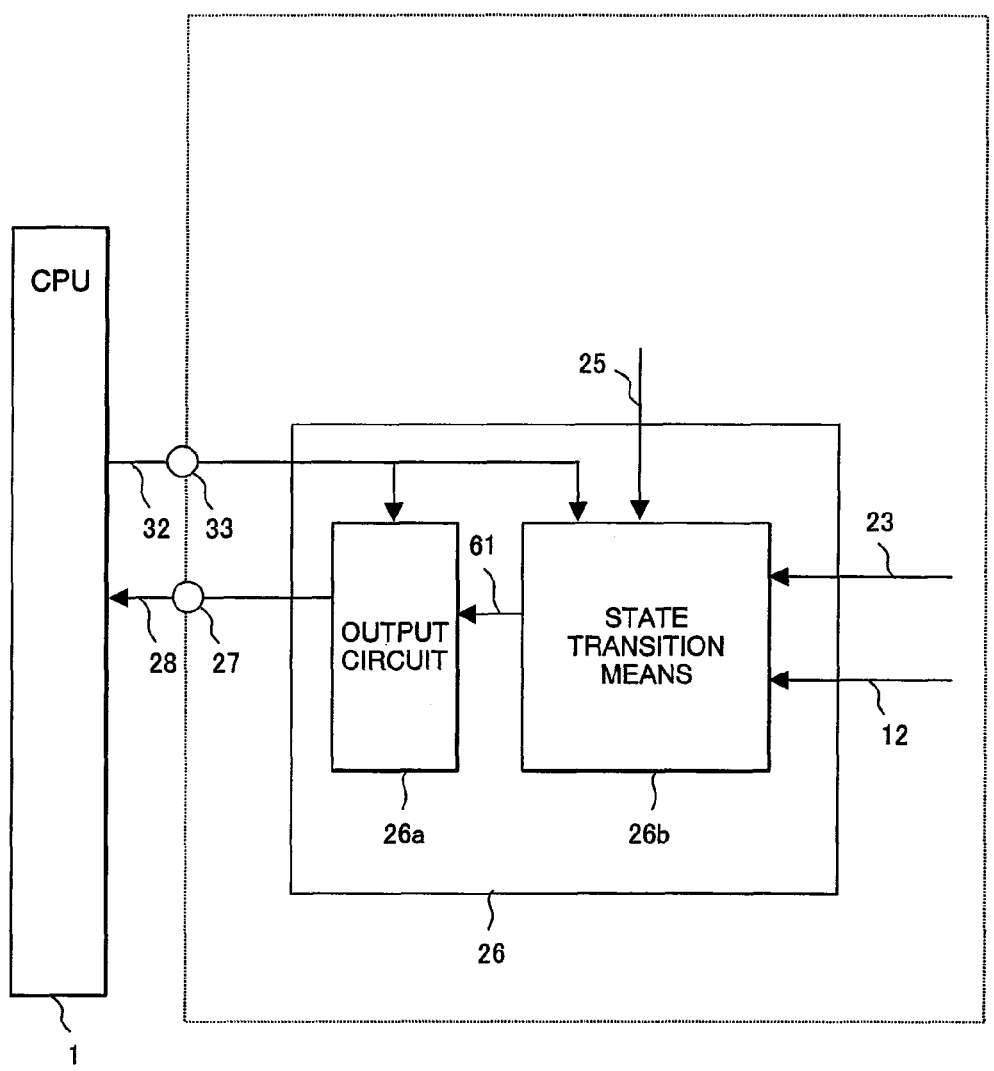
FIG. 8 is a block diagram for use in explaining the internal constitution of a diagnostic output means 26 included in the third embodiment of the present invention.

FIG. 8 is an explanatory diagram for use in explaining the internal constitution of the diagnostic output means 26. In FIG. 8, there are shown an output circuit 26a that outputs the CPU readout diagnosis signal 28 on the basis of the CPU readout control signal 32, and a state transition means 26b that makes a state transition on the basis of the overcurrent detection signal 23, overcurrent break holding signal 25, gate signal 12, and CPU readout control signal 32. The other components are identical to those of the aforesaid embodiments.

Figure 9:
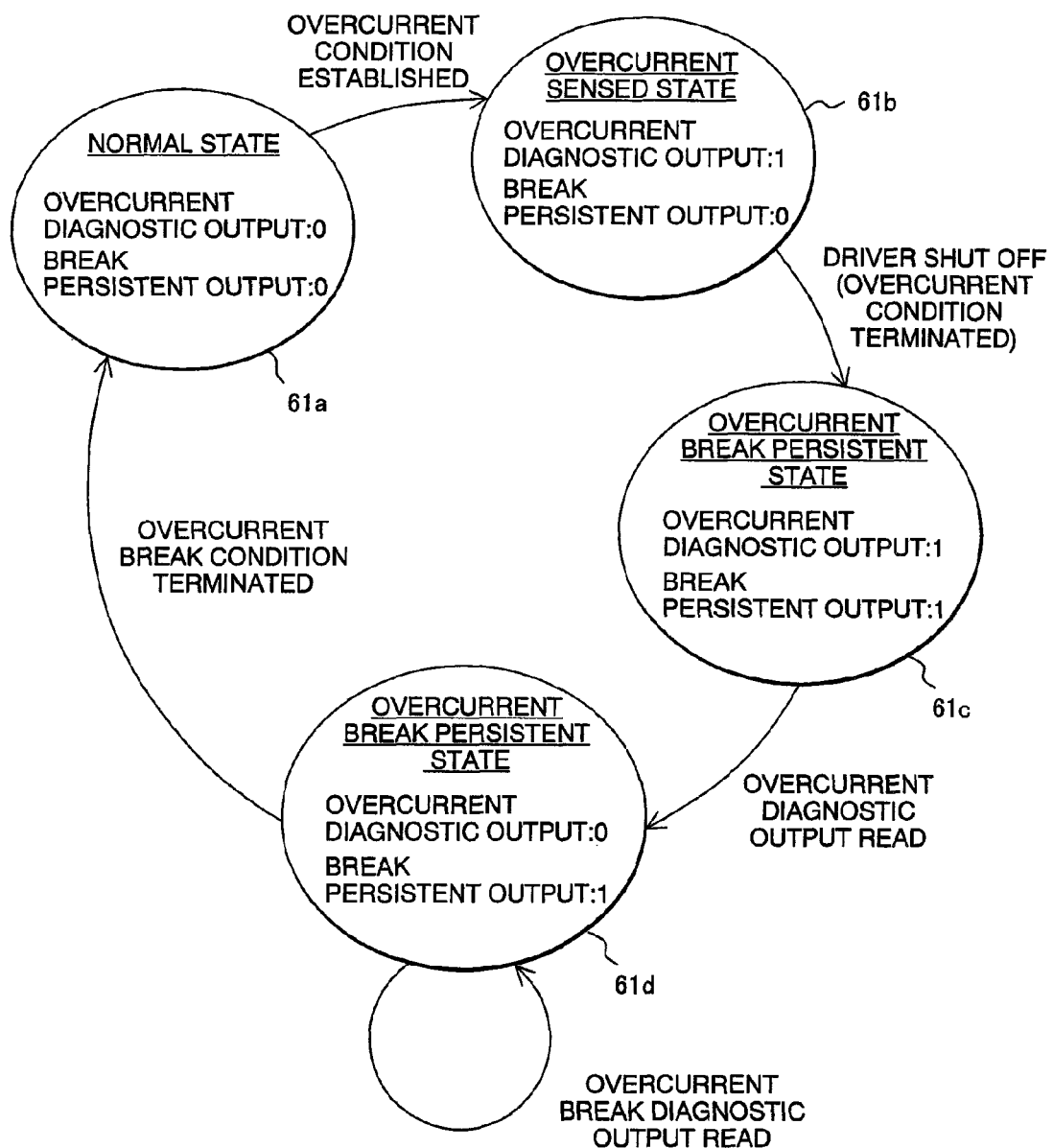
FIG. 9 is a state transition chart for use in explaining a state transition made by the diagnostic output means 26 included in the third embodiment of the present invention.
Figure 10:
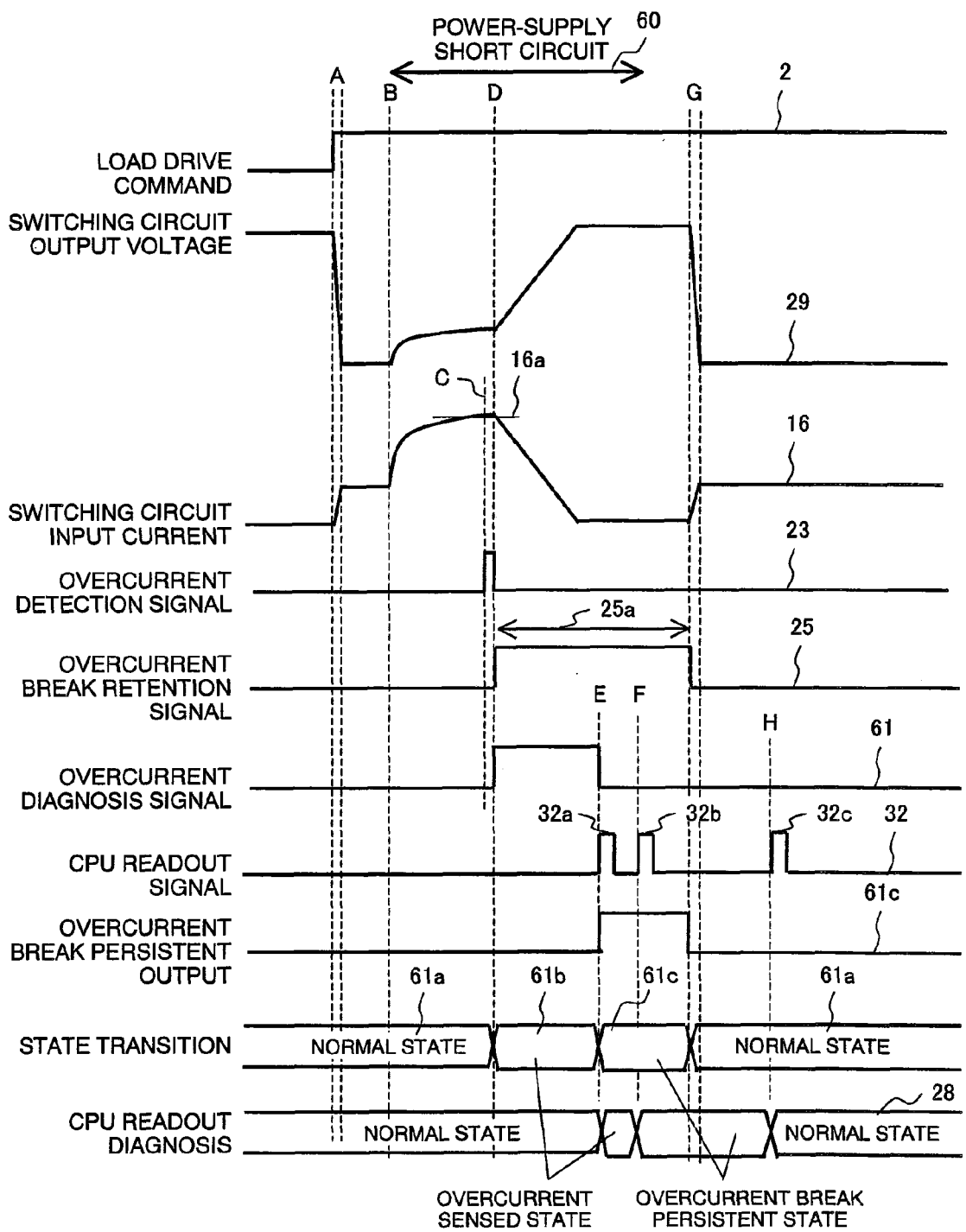
FIG. 10 is a timing chart for use in explaining actions to be performed in order to make the state transition shown in FIG. 9.

Actions to be performed in the present embodiment will be described in conjunction with FIG. 9 and FIG. 10. FIG. 9 is a state transition chart showing a state transition made by the state transition means 26b. FIG. 10 is a timing chart for use in explaining the actions to be performed in the third embodiment. In FIG. 9 and FIG. 10, the load drive command with which the semiconductor switching circuit 13 is turned on is inputted at timing A. When the semiconductor switching circuit 13 is turned on, an overcurrent diagnostic output 61 is made to a normal state (61a).

Thereafter, a short circuit condition 60 is established at timing B. At timing C, the overcurrent detection threshold 16a is exceeded, and the overcurrent detection signal 23 is outputted. When the semiconductor switching circuit is broken, the state of the state transition means 26b is shifted to a state 61b, that is, an overcurrent sensed state. An overcurrent diagnostic output is set to 1. After the semiconductor switching circuit 13 is broken, the state is shifted to a state 61c. The overcurrent diagnostic output is set to 1, and a break persistent output is set to 1.

Thereafter, the CPU readout signal 32 is inputted from the CPU control means 1 to the state transition means 26b in order to read a diagnostic state. The state transition means 26b makes a transition from the overcurrent sensed state 61c to an overcurrent break persistent state 61d. The overcurrent diagnostic output is set to 0, and the break persistent output is set to 1. The state is sustained for a predetermined time and persists until the timing G at which the semiconductor switching circuit 13 is turned on next. Even if the CPU readout signal 32 is inputted multiple times in the meantime, the overcurrent break persistent state 61d is not shifted. When the semiconductor switching circuit 13 is turned on again at the timing G, the state transition means 26b makes a transition from the overcurrent break persistent state 61d to the normal state 61a.

Consequently, if an overcurrent break occurs, the CPU control means 1 can not only acquire information signifying that an overcurrent condition is established and sensed but also grasp a state in which: although the load drive command 2 is high, breaking the semiconductor switching circuit 13 is executed; after no current flows any longer, the break persists and the semiconductor switching circuit 13 remains off. Therefore, the CPU control means 1 can take measures in various manners.

Figure 11:
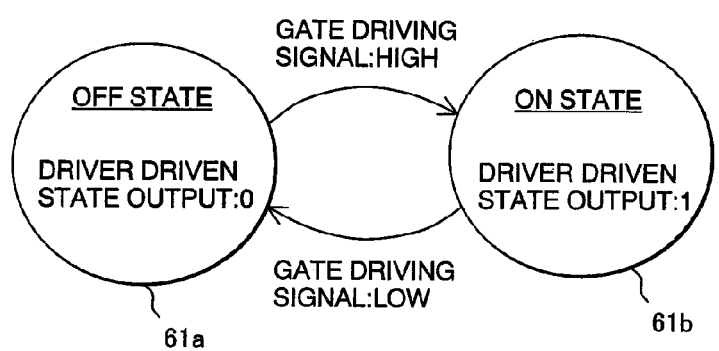
FIG. 11 is a state transition chart for use in explaining a state transition to be performed by the diagnostic output means 26 included in the third embodiment of the present invention in order to exert another advantage.
Figure 12:
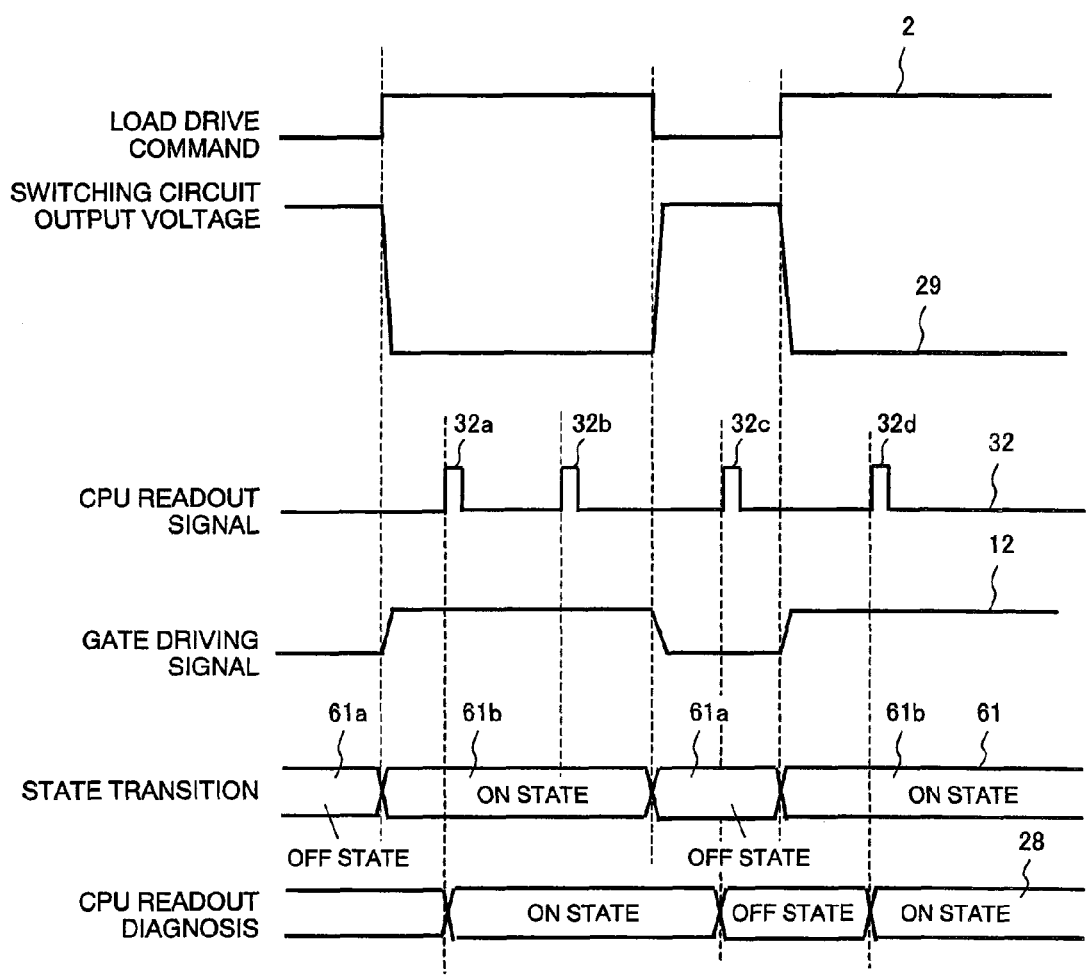
FIG. 12 is a timing chart for use in explaining actions to be performed in order to make the state transition shown in FIG. 11.

Next, the second advantage of the third embodiment will be described below. FIG. 11 is a state transition chart for use in explaining the second advantage, and FIG. 12 is a timing chart. In the third embodiment, the gate driving signal 12 is directly inputted to the diagnostic output means 26. At this time, an off state 61a in which the gate driving signal is high is, as shown in the state transition chart of FIG. 11, shifted to an on state 61b according to the polarity of the gate driving signal 12. When the gate driving signal is driven low, the on state 61b is shifted to the off state 61a. The state transition signal is read in response to the CPU readout signal 32, whereby the state of the semiconductor switching circuit 13 can be reliably detected irrespective of the load drive command 2 fed from the CPU control means 1.

Therefore, for example, even when an overcurrent break occurs, the load driving means including the state transition means 26b can sense the state in which although the load drive command is high, the semiconductor switching circuit 13 is off.

Figure 13:
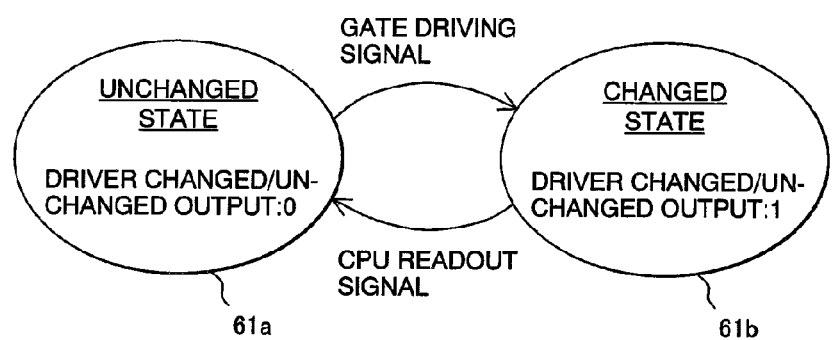
FIG. 13 is a state transition chart for use in explaining a state transition to be made by the diagnostic output means 26 included in the third embodiment of the present invention in order to exert another advantage.
Figure 14:
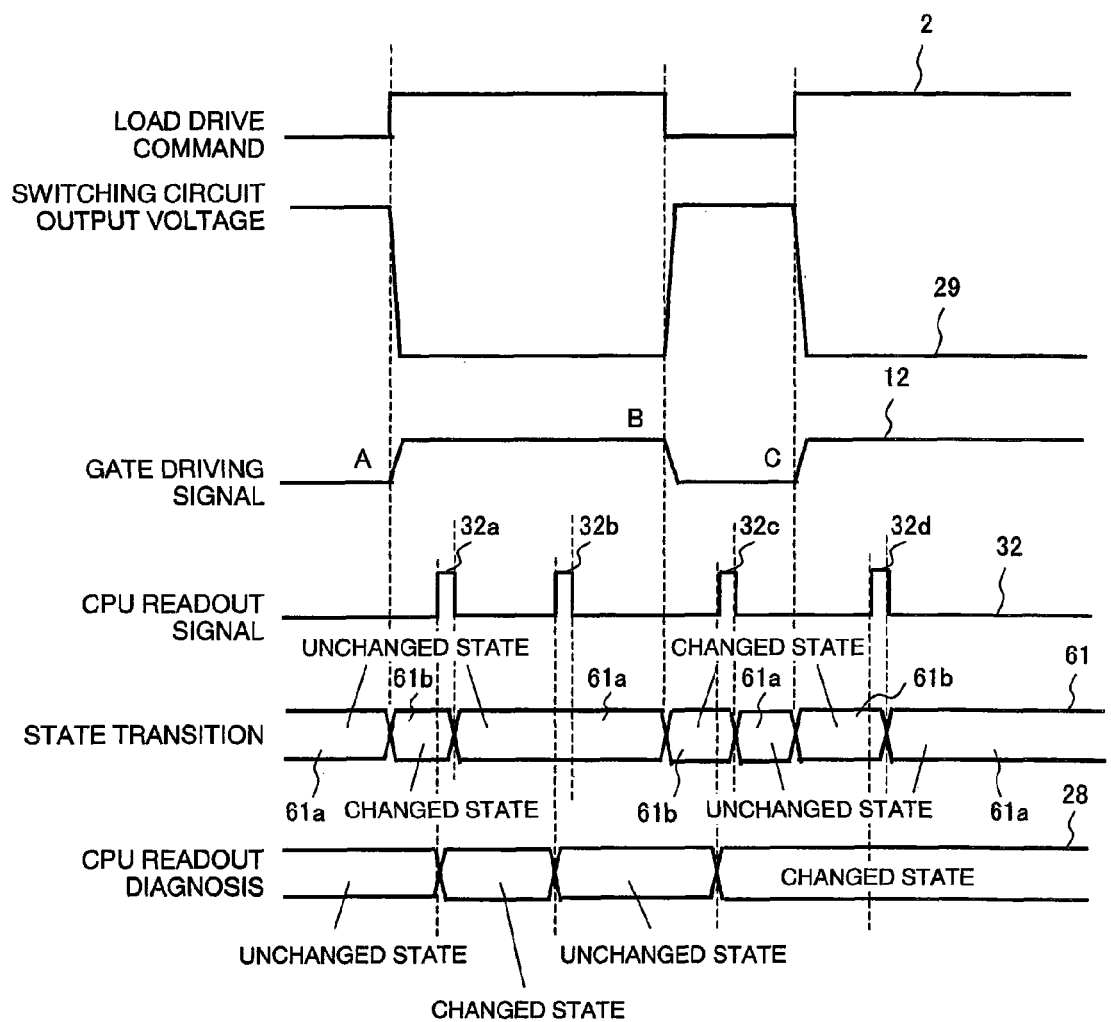
FIG. 14 is a timing chart for use in explaining actions to be performed in order to make the state transition shown in FIG. 13.
Figure 15:
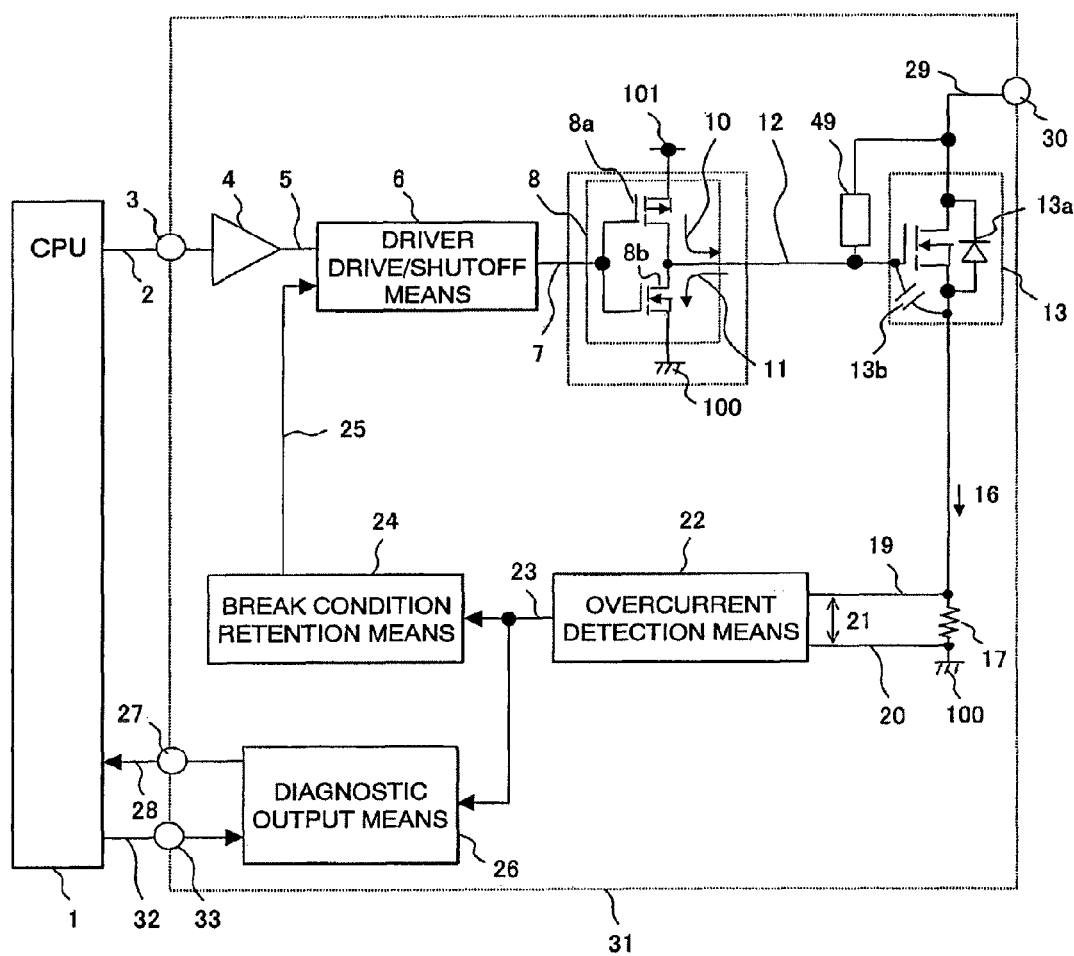
FIG. 15 is a block diagram for use in explaining a related art.
Figure 16:
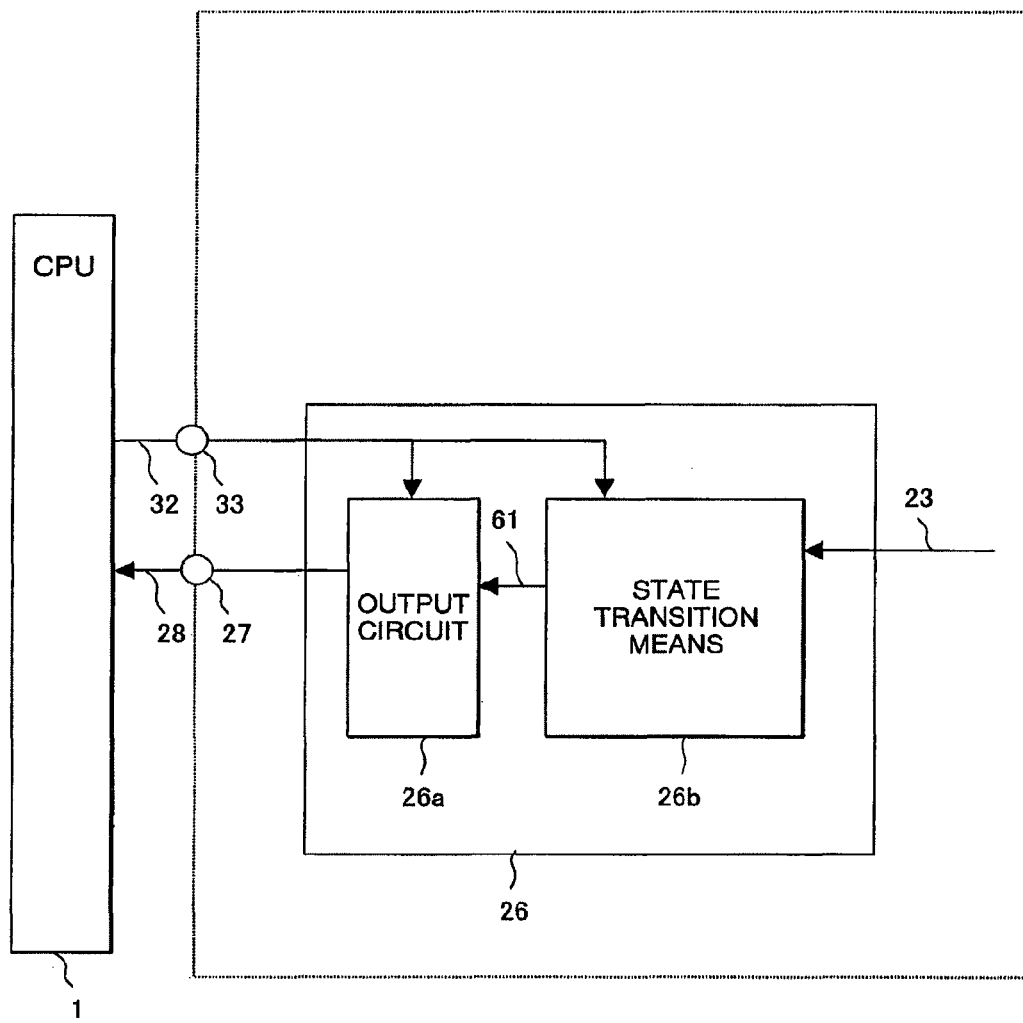
FIG. 16 is a block diagram for use in explaining the internal constitution of a diagnostic output means 26 included in the related art.
Figure 17:
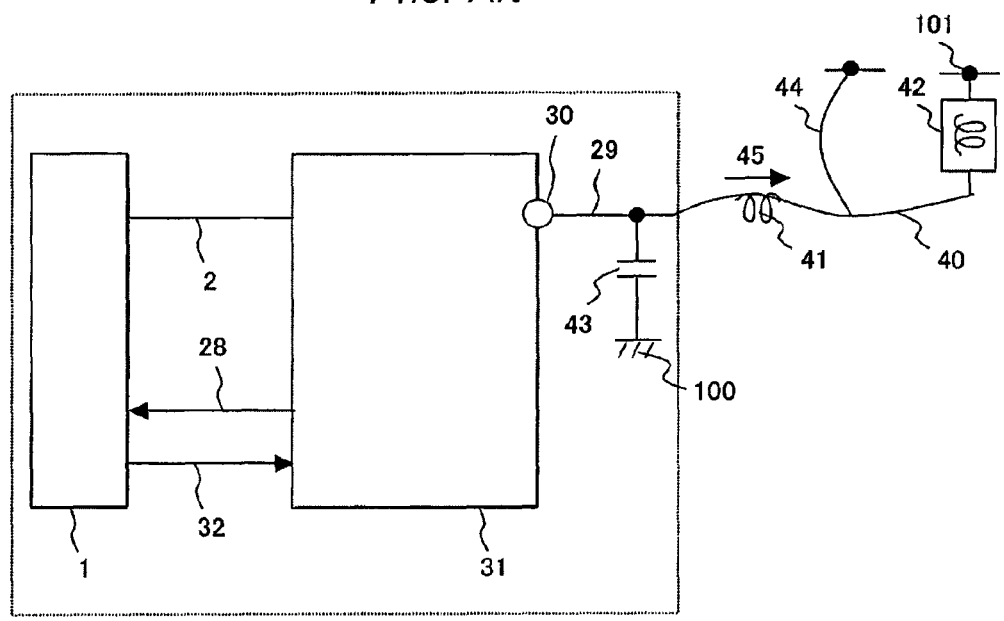
FIG. 17 is a block diagram for use in explaining an example of use of the related art.
Figure 18:
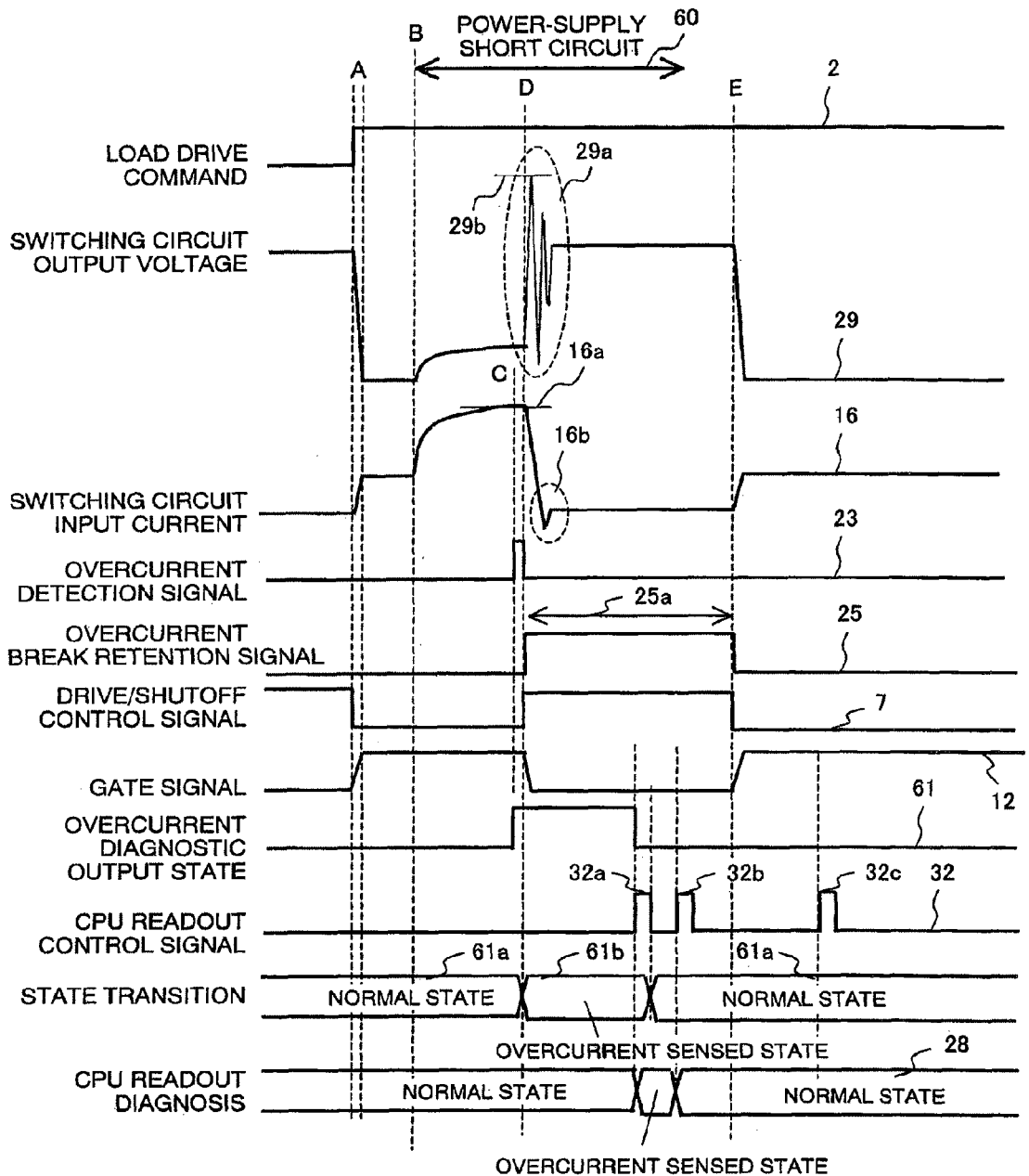
FIG. 18 is a timing chart for use in explaining actions to be performed by the related art.
Figure 19:
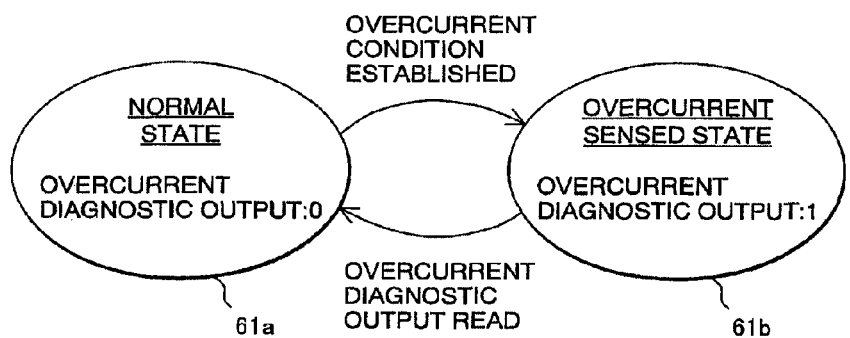
FIG. 19 is a state transition chart for use in explaining a state transition to be performed by the diagnostic output means 26 included in the related art.

The third advantage of the third embodiment will be described below. FIG. 13 is a state transition chart for use in explaining the third advantage, and FIG. 14 is a timing chart. In the third embodiment, the gate driving signal 12 is directly inputted to the diagnostic output means 26, and the CPU readout signal is inputted to the diagnostic output means at the same time. At every polarity change edge of the gate driving signal 12 (timing A, B, or C in the drawing), a transition is made from an unchanged state 61a to a changed state 61b.

When the state transition signal is read in response to the CPU readout signal 32, the changed state 61b is shifted to the unchanged state 61a. Namely, the unchanged state 61a is shifted to the changed state 61b at timing A in FIG. 14. Thereafter, when the state transition signal is read in response to the CPU readout signal 32a, the changed state 61b is shifted to the unchanged state 61a. When the state transition signal is read in response to the CPU readout signal 32b, since the gate driving signal 12 has not changed, the unchanged state 61a is held intact. When the state transition signal is read in response to the CPU readout signal 32c, since the gate driving signal 12 has changed at timing B, a transition is made from the unchanged state 61a to the changed state 61b. The same applies to the CPU readout signal 32d.

Owing to the state transition means that acts as mentioned above, at the current diagnostic readout timing, irrespective of the load drive command 2 fed from the CPU control means 1 at the previous diagnostic readout timing, the CPU control means can decide whether the semiconductor switching circuit 13 is turned on or off.

Owing to the load driving means including the state transition means 26b, for example, if an overcurrent break occurs, the state in which although the load drive command is high, the semiconductor switching circuit 13 is off can be sensed. Moreover, for example, when the load drive command is a PWM control signal, that is, when the CPU control means 1 cannot grasp the energized or de-energized state of the driver, the semiconductor switching circuit can be checked to see if it normally repeats the on and off states. Consequently, since whether a break has occurred due to an overcurrent condition or the like can be reliably decided, a highly reliable load driving means can be provided.

What is claimed is:

1. A load driving and diagnosis system that includes a switching circuit which feeds a current to a connected load, a voltage holding means which holds the output terminal voltage of the switching circuit at a predetermined value, and a current detection means which detects a current flowing into the load, wherein:

a plurality of predetermined values is set as values of voltages at which the voltage holding means holds the output terminal voltage;

a switching means is included for switching the plurality of predetermined values, at which the voltage holding means holds the output terminal voltage, according to the output of the current detection means; and the plurality of predetermined values at which the output terminal voltage is held includes a first predetermined value which is larger than the value of a supply voltage and at which a load current that flows when the load is energized or de-energized is quickly blocked, and a second predetermined value that is smaller than the first predetermined value and is slightly larger than the value of the supply voltage; and the load driving and diagnosis system further comprises, a diagnostic detection means that detects whether the current detected by the current detection means is identical with the predetermined value, a holding means that sustains the output signal of the diagnostic detection means for a predetermined time, and a control circuit that controls the on and off states of the switching circuit according to the output of the holding means, and outputs the output of the holding means to outside; and a state transition means that changes states thereof according to the output of the diagnostic detection means and the output of the holding means, and a diagnostic output means that outputs the output of the state transition means to outside.

2. The load driving and diagnosis system according to claim 1, further comprising a delay means that delays the output signal of the current detection means by a predetermined time, and a control circuit that switches the predetermined values, at which the voltage holding means holds the output terminal voltage, earlier than a break of the switching circuit.

3. The load driving and diagnosis system according to claim 1, further comprising a delay means that delays the output signal of the current detection means by a predetermined time, a driver means that breaks the switching circuit according to the output of the current detection means and that has a plurality of predetermined values set for a control current serving as a break reference, and a control circuit that switches the plurality of predetermined values, which is set for the control current in the driver means, earlier than the break of the switching circuit.

4. The load driving and diagnosis system according to claim 1, further comprising a driver means that controls the on and off states of the switching circuit, and an output means that outputs the output of the driver means to outside.

5. The load driving and diagnosis system according to claim 4, further comprising a state transition means that changes states thereof according to the output of the driver means, and a diagnostic output means that outputs the output of the state transition means to outside.

6. The load driving and diagnosis system according to claim 1, further comprising a driver means that controls the on and off states of the switching circuit, a control means that controls the driver means, a state transition means that changes states thereof according to a state readout signal sent from the control means and the output of the driver means, and a diagnostic output means that outputs the output of the state transition means to outside.

7. The load driving and diagnosis system according to claim 6, further comprising a state transition means that changes states thereof according to the output of the driver means and returns to an initial state in response to a readout signal sent from the control means.

8. A load driving semiconductor system in which the load driving and diagnosis system in accordance with claim 1 is implemented.

* * * * *